United States Patent [19]
Lee

[11] Patent Number: 5,740,019
[45] Date of Patent: Apr. 14, 1998

[54] APPARATUS FOR MOUNTING A PRINTED CIRCUIT BOARD IN A MONITOR CASE

[75] Inventor: Man-yeab Lee, Kyungki-do, Rep. of Korea

[73] Assignee: Samsung Electronics Co., Ltd., Suwon, Rep. of Korea

[21] Appl. No.: 524,442

[22] Filed: Sep. 6, 1995

[30] Foreign Application Priority Data

Sep. 6, 1994 [KR] Rep. of Korea ............. 94-22876

[51] Int. Cl.$^6$ .................................................. H05K 5/00
[52] U.S. Cl. ........................ 361/759; 361/752; 361/816
[58] Field of Search .......................... 361/740, 759,
361/752, 807, 825, 816, 818; 174/138 G;
248/235, 500, 506, 573; 292/80, 147

[56] References Cited

U.S. PATENT DOCUMENTS

| | | | |
|---|---|---|---|
| 4,226,491 | 10/1980 | Kazama et al. | 361/759 X |
| 5,144,533 | 9/1992 | Annett | 361/759 X |
| 5,490,038 | 2/1996 | Scholder et al. | 361/759 |

Primary Examiner—Leo P. Picard
Assistant Examiner—Jayprakash N. Gandhi
Attorney, Agent, or Firm—Banner & Witcoff, Ltd.

[57] ABSTRACT

An apparatus for mounting a printed circuit board in a monitor case including a frame and a plurality of resilient members cooperating therewith to removably fasten the printed circuit board onto the frame. The printed circuit board includes apertures adapted to receive an engaging member integrally provided on the frame to locate and align the printed circuit board. The resilient members comprise upper portions having resiliently biased elements which secure the engaging member of the frame, and lower portions having affixing tabs adapted to be received in apertures formed in the printed circuit board. The frame also includes a support brace to fully support the printed circuit board to prevent sagging and deformation. The printed circuit board is removably retained on the frame by cooperation of the engaging member and resilient elements such that assembly and disassembly is facilitated thereby saving time and enhancing production yield.

14 Claims, 5 Drawing Sheets

APPARATUS FOR MOUNTING A PRINTED CIRCUIT BOARD IN A MONITOR CASE

CROSS-REFERENCE TO RELATED APPLICATIONS

This application makes reference to, incorporates the same herein, and claims all benefits accruing under 35 U.S.C. §119 from an application for a Printed Circuit Board Fixing Structure for a Monitor earlier filed in the Korean Industrial Property Office on Sep. 6, 1994, which was duly assigned Ser. No. 94-22876 by that Office.

BACKGROUND OF THE INVENTION

The present invention relates to a structure for mounting a printed circuit board within a monitor case, and more particularly, to an apparatus for stably mounting a printed circuit board (PCB) to enable for easier assembly and disassembly. The apparatus facilitates installation of the PCB within the monitor case, and also prevents the PCB and monitor case from sagging due to the weight of the electronic components mounted on the PCB, while simultaneously shielding it from any electromagnetic waves generated from a cathode ray tube of the monitor when current is applied.

Monitors are widely used in office automation equipment, information and telecommunications and television systems. The PCB is one of the important components of monitors, and is installed inside the monitor case. As shown in FIG. 1, typically a PCB 10, onto which a variety of electronic components are generally mounted, has a plurality of apertures 10a formed therein. A shield frame 12 for securely supporting and firmly mounting the PCB by screws 11 is provided under the PCB. A bracket 13 is integrally formed on at least two of the four side walls of shield frame 12. Bracket 13 is provided with mounting apertures 13a which are disposed to align vertically with corresponding apertures provided in PCB 10.

In another conventional apparatus, as seen in FIG. 2, a flat shield frame 20 is used and disposed in parallel relation underneath PCB 10. A C-shaped bracket 21 is inserted and fastened between the flat shield frame piece and the PCB to firmly affix and safely isolate the PCB. Bracket 21 has junction holes 21a therein which are aligned with both mounting aperture 20a formed in the flat shield frame, and aperture 10a formed in the PCB. Screws 11 are received in the aligned apertures to firmly affix the PCB to the shield frame.

In the first conventional PCB mounting structure constructed as described above and as seen in FIG. 1, PCB 10 is securely affixed onto shield frame 12 by screws 11 by aligning PCB aperture 10a to a corresponding mounting aperture 13a in bracket 13. In addition, in the second conventional embodiment as shown in FIG. 2, a C-shaped bracket 21 is first inserted between PCB 10 and flat shield frame 20, and PCB aperture 10a, mounting aperture 20a of shield frame 20, and junction holes 21a of bracket 21 are all vertically aligned. Then PCB 10 is affixed to the shield frame by screws 11 which are received in the aligned apertures to fasten the PCB to the shield frame.

In the conventional PCB mounting structure constructed as described above, since screws are used for assembling the PCB onto the shield frame each screw must be individually fastened thereby making the assembly process time consuming and inefficient. Such a configuration may well result in sagging or distortion of the PCB due to the weight of the electronic components mounted on the PCB, and is thus prone to failure. In addition, due to manipulation and variation in the engaging forces of the screws, concentrated stresses occur at and around the periphery of each aperture formed in the PCB. Such stresses can propagate and extend across the entire surface of the PCB thereby causing cracks in the circuit board. Among the drawbacks of the prior art structures are decreased yield of production caused by complicated or inconvenient assembly and increased production costs. In addition, the structures are not amenable to easy disassembly for repair which increases the costs of maintenance.

SUMMARY OF THE INVENTION

Therefore, it is an object of the present invention to provide an apparatus for mounting a PCB onto a shield frame in a monitor case which will achieve higher productivity and save costs by facilitating assembly and disassembly.

It is another object of the present invention to provide a PCB mounting apparatus which prevents the PCB from sagging and possible deformation.

It is still another object of the present invention to provide a PCB attachment apparatus which enables quick assembly and disassembly, thereby making repair more convenient and enhancing productivity yield.

These objects of the invention are achieved by providing an apparatus comprising an engaging key on a frame and a clip which is configured to resiliently engage the key thereby mounting a PCB therebetween to facilitate assembly and disassembly.

To accomplish the objects of the present invention, there is provided an apparatus for mounting a PCB within a monitor case in which an engaging key and isolation aperture are integrally formed at the bottom of a frame which supports the PCB. Integrally formed on the PCB are a key aperture which receives the engaging key of the frame, and insertion apertures. The engaging key extends through the key aperture and an upper portion of the key extends upward perpendicular to the PCB surface. In addition, the apparatus includes a plurality of resilient members each having affixing tabs adapted to be affixed in the insertion apertures and affixed to the thin copper film surface of the PCB by soldering. Each resilient member contacts and resiliently grips the upper portion of an engaging key to make assembly and disassembly easier.

A more complete appreciation of the present invention, and many of the attendant advantages thereof, will become readily apparent and are best understood by reference to the following detailed description when considered in conjunction with the accompanying drawings.

In the following detailed description, many specific details are set forth to provide a more thorough understanding of the present invention. It will be apparent, however, to those skilled in the art, that the present invention may be practiced without these specific details. In other instances, well known components have not been described so as not to obscure the present invention.

DETAILED DESCRIPTION OF PREFERRED EMBODIMENTS

Figure 1:
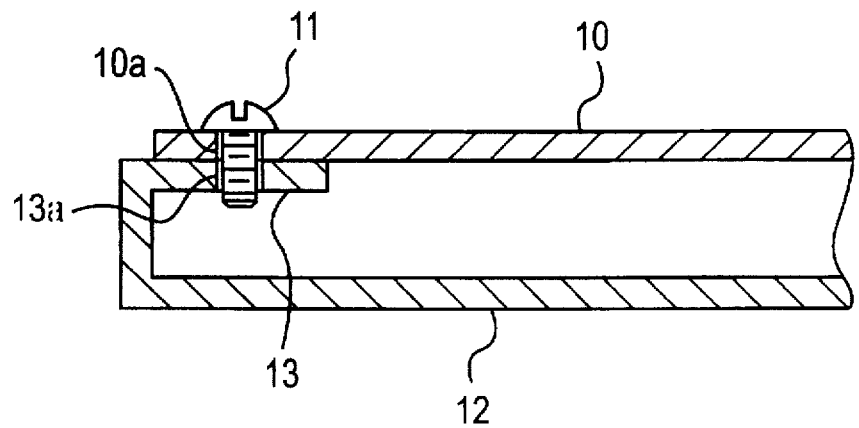
FIG. 1 is a cross-sectional view schematically illustrating a conventional PCB fixing apparatus in a monitor case.
Figure 2:
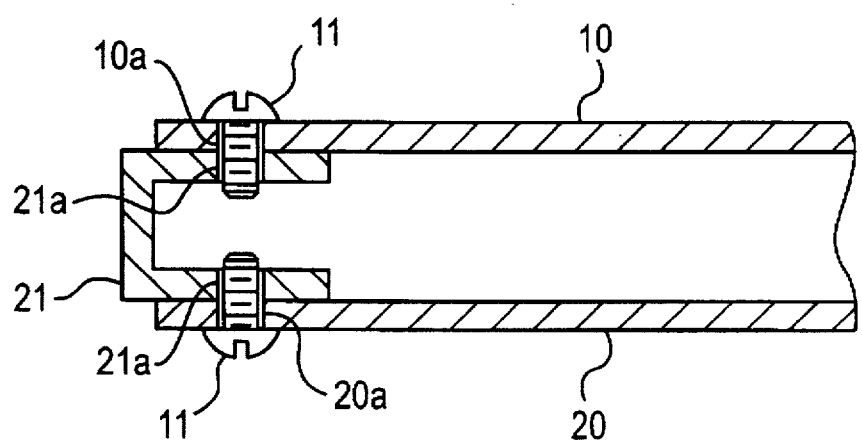
FIG. 2 is a cross-sectional view illustrating another embodiment of a conventional PCB fixing apparatus in a monitor case.
Figure 3:
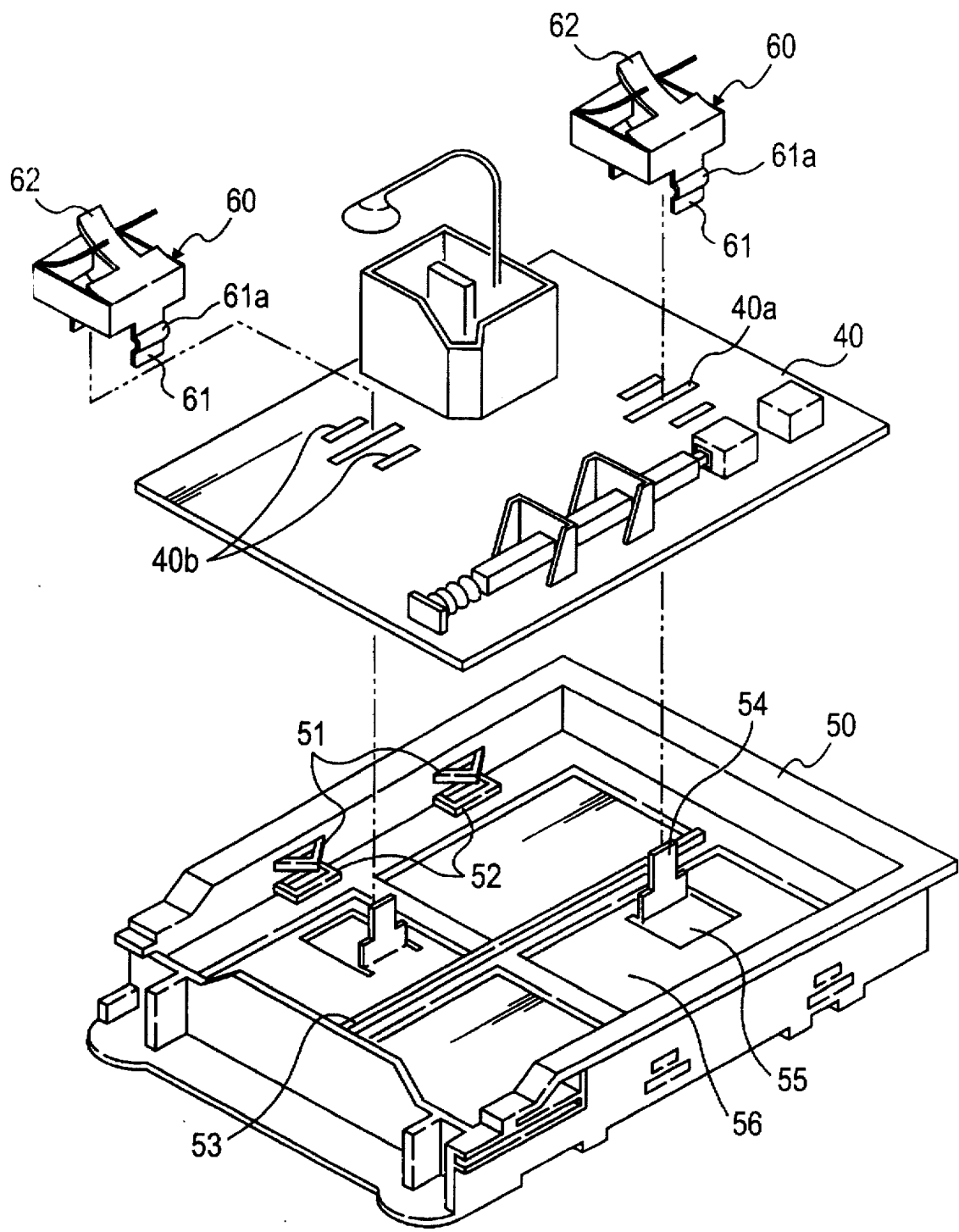
FIG. 3 is an exploded perspective assembly view of a first preferred embodiment of the apparatus for mounting a printed circuit board in a monitor case in accordance with the present invention.
Figure 4:
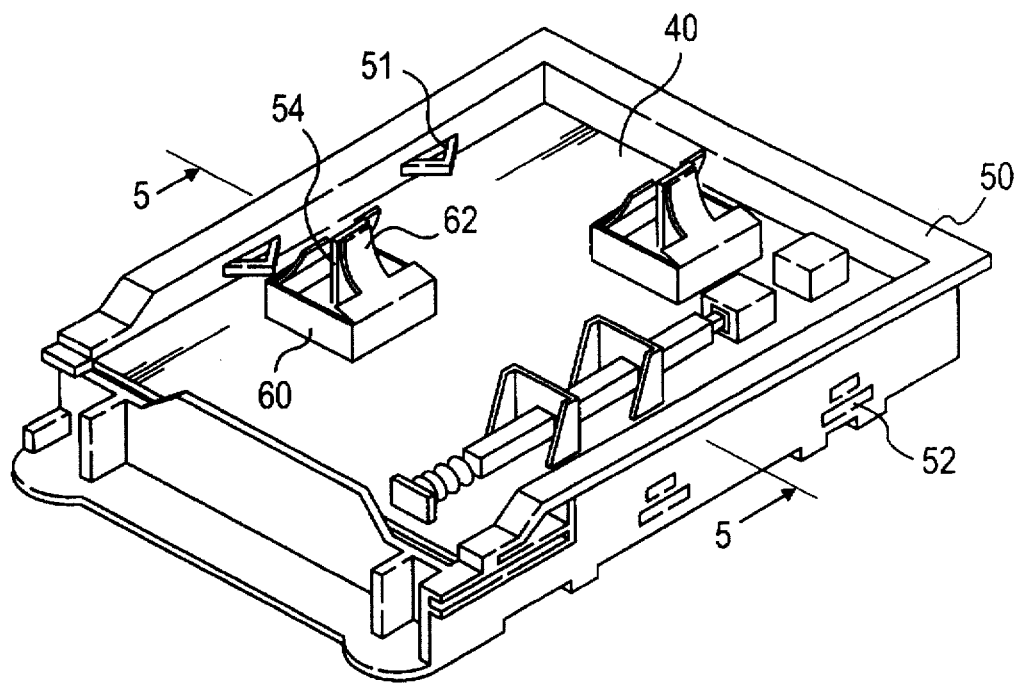
FIG. 4 is a perspective view of the apparatus of FIG. 3, shown assembled.
Figure 5:
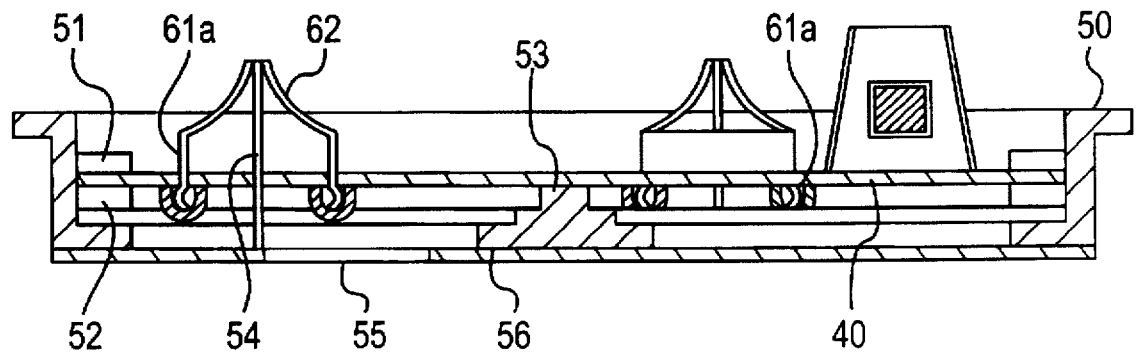
FIG. 5 is a cross-sectional view of the assembled apparatus taken along line 5—5 of FIG. 4.

Turning now to the drawings and referring to FIG. 3, there is illustrated a first preferred embodiment of the printed circuit board mounting apparatus for securely mounting PCB 40 within a monitor case. The apparatus broadly comprises a rectangular frame 50 configured to facilitate mounting a PCB, and clips 60 to securely fasten the PCB onto the frame.

In the apparatus of the first preferred embodiment, PCB 40 includes a plurality of rectangular slots 40a formed therein. A pair of insertion apertures 40b are formed on either side of and in parallel relation to each slot 40a.

Frame 50, preferably molded of plastic material, is adapted to mount thereon a PCB having a variety of surface-mounted electronic components. Frame 50 comprises a plurality of first locking protrusions 51 integrally formed on at least two of the upstanding side walls of frame 50, preferably on opposite side walls which face one another. A plurality of second locking protrusions 52 are also integrally formed on those same side walls, and spaced a distance below the first locking protrusions. Frame 50 also includes a support brace 53 protrudently formed across the bottom of the frame, and as shown in FIG. 3, preferably spanning its entire length for supporting PCB 40. Brace 53 prevents PCB 40 from sagging due to the weight of the surface-mounted electronic components. Also provided on the bottom of frame 50, underneath brace 53 is a shield plate 56 with isolation apertures 55 which are each adjacent to vertical tabs which are bent approximately 90° with respect to the horizontal bottom of the frame. These tabs each comprise an engaging key 54 which is disposed to be received in a mating rectangular slot 40a of PCB 40 when the circuit board is mounted to frame 50. Engaging keys 54 couple PCB 40 to shield plate 56 to thereby shield PCB 40 from electromagnetic waves generated from a cathode ray tube (CRT), and can be integrally formed on frame 50 as shown or may be otherwise linked to a conductive strip for use.

To complete mounting of PCB 40 to frame 50, a plurality of resilient clips 60 adapted to be firmly affixed to an area of a thin copper film wiring on PCB 40, are provided. A pair of substantially vertical, parallel affixing tabs 61, also of resilient material, are integrally formed on the lower portion of each clip 60. Each tab 61 includes a bight 61a formed generally on the centered portion of tab 61. Bights 61a preferably have outwardly disposed beveled surfaces. The upper portion of clip 60 includes an integral resilient yoke 62 comprising a resilient member corresponding to each affixing tab 61. The resilient members of yoke 62 are biased in a crossed relation to one another. Any number and shape of tabs 61 may be used and various such arrangements are contemplated to be within the scope of the present invention.

The operation of the first preferred embodiment of the present invention will now be described by way of a non-limiting example. To assemble the apparatus, PCB 40 is tilted at a predetermined angle so that one side edge thereof is inserted between first locking protrusions 51 and second locking protrusions 52 along one side wall of frame 50. The opposite side of PCB 40 is lowered to rest on top of first locking protrusions 51 along the opposite side wall of frame 50. The PCB is then pushed slightly downward to be press-fitted between the locking protrusions along the opposite side wall of frame 50. In this manner, the PCB is automatically shielded from electromagnetic waves and grounded to a shield plate 56 when the PCB is assembled to frame 50 by engaging keys 54. In this manner, the bottom of PCB 40 contacts support brace 53 and the PCB is fully supported along its length to prevent any sagging of the PCB from the weight of the surface-mounted electronic components.

It can be seen that when the PCB is press-fitted onto the frame as described, each engaging key 54 which is perpendicularly disposed with respect to the bottom surface of frame 50 is inserted into its respective rectangular slot 40a of PCB 40. Thus, a portion of each engaging key 54 extends through slot 40a and above the surface of PCB 40. Onto each engaging key 54, a clip 60 is arranged by slipping the clip over the key such that the tabs of yoke 62 are pushed away from one another and key 54 is inserted between the yoke tabs. The biasing force of the yoke tabs fastens key 54 in clip 60. Affixing tabs 61 of each clip 60 are also inserted into their corresponding insertion apertures 40b until bights 61a engage the inner surface of apertures 40b. When tabs 61 are thus engaged within apertures 40b, bights 61a prevent the tabs from deviating upon external impact. In order to ensure that clips 60 do not deviate once assembled, affixing tabs 61 may be soldered to PCB 40. Clips 60 can thus be more or less permanently attached to PCB 40.

If PCB 40 needs to be replaced or repaired due to damage to some of the PCB mounted electronic components, the PCB can be removed by pushing upward on it by inserting a tool or finger into rectangular isolation apertures 55. The PCB can be detached easily from frame 50 by disengaging keys 54 from yokes 62.

Figure 6:
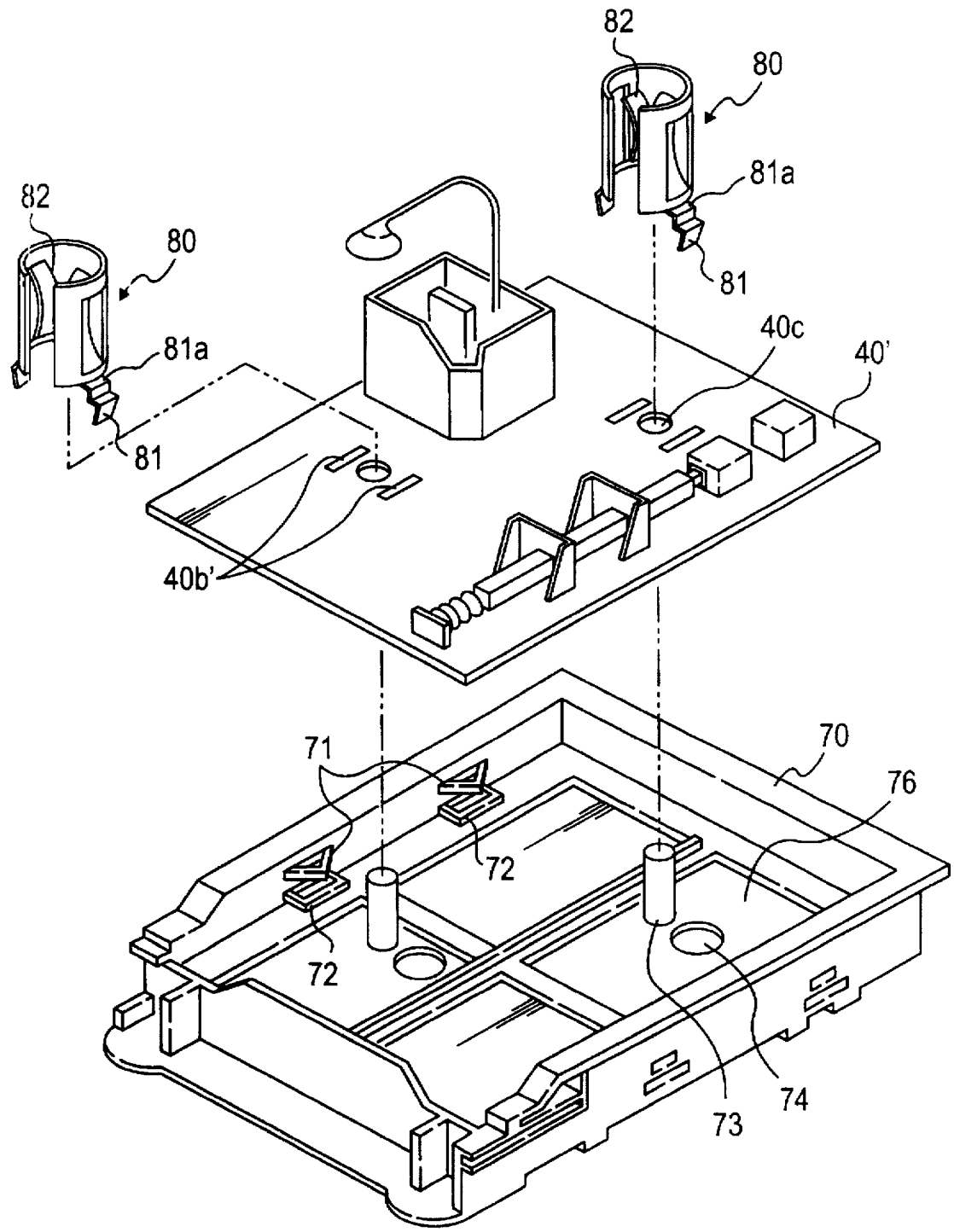
FIG. 6 is an exploded perspective assembly view of a second preferred embodiment of the mounting apparatus of the present invention.
Figure 7:
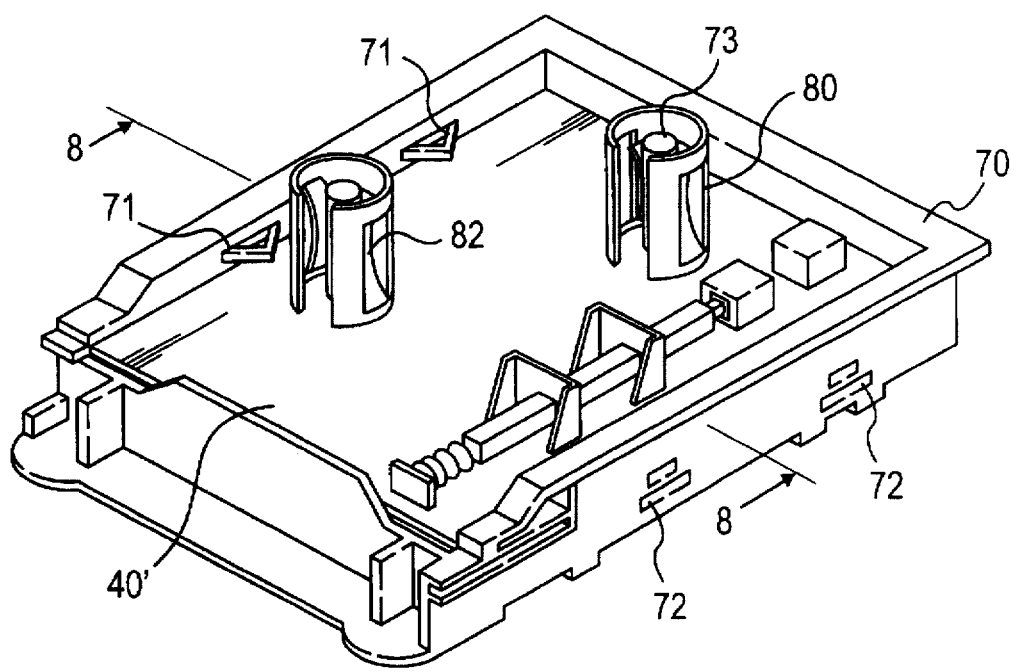
FIG. 7 is a perspective view of the apparatus of FIG. 6, shown assembled.
Figure 8:
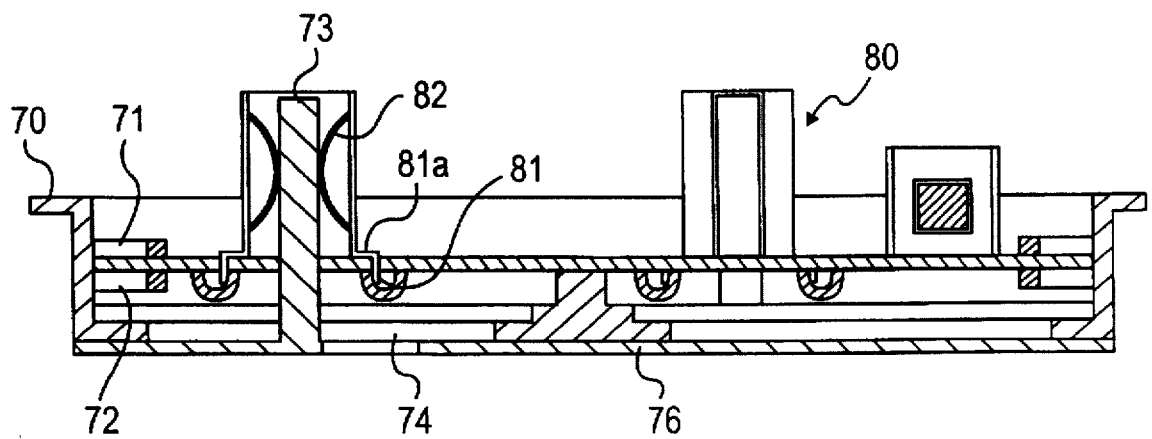
FIG. 8 is a cross-sectional view of the assemble apparatus taken long line 8—8 of FIG. 7.

Referring to FIGS. 6–8, a second preferred embodiment of the PCB mounting apparatus is illustrated. In this embodiment, a PCB 40' includes a plurality of circular apertures 40c formed therein, and a pair of insertion apertures 40b' are formed on either side of each circular aperture 40c in parallel relation to one another similar to those in FIG. 3.

Frame 70 comprises first and second locking protrusions 71 and 72 integrally formed on at least two of the upstanding side walls of frame 70 for receiving PCB 40', and preferably on opposite side walls which face one another. Similar to the first embodiment, second locking protrusions 72 are spaced a distance below first locking protrusions 71. At the bottom of frame 70, underneath the brace is a shield plate 76 with at least one cylindrical engaging pin 73, and at least one isolation aperture 74. Engaging pin 73 is disposed to be received in mating circular aperture 40c of PCB 40' when the circuit board is mounted to frame 70.

A plurality of resilient members 80 are provided to complete mounting of the PCB onto frame 70. Each resilient member 80 also comprises downwardly extending, substantially vertical, parallel affixing tabs 81 integrally formed on the lower portion. Each tab 81 includes a bight 81a formed generally on the centered portion of tab 81, and bights 81a preferably have outwardly disposed beveled surfaces. The upper portion of each resilient member 80 is substantially cylindrical in shape and includes integral, opposed resilient spring elements 82 which resemble leaf springs that are biased toward, and contact one another.

The assembly process of the second embodiment of the PCB mounting apparatus is similar to that of the first embodiment, and will be explained below in greater detail.

First, PCB 40' is tilted at a predetermined angle and one side is inserted between first and second locking protrusions 71 and 72 protrudently formed either one side wall of frame 70. Thereafter, the opposite side of PCB 40' is lowered to reset on top of first locking protrusions 71 along the opposite side wall of frame 70. The PCB is then pushed slightly downward to be press-fitted between the locking protrusions. By doing so, PCT 40' is prevented from sagging due to the weight of surface-mounted electronic components, since the bottom of PCB 40' is safely placed over the brace portion of frame 70 which protrudes perpendicularly from the bottom of the frame.

When PCB 40' is inserted between first and second locking protrusions 71 and 72, each cylindrical engaging pin 73 is received in its corresponding circular aperture 40c to securely align the PCB and the frame. A resilient member 80 is then slipped over each engaging pin 73 such that spring elements 82 are pushed away from one another and pin 73 is inserted between the spring elements. The biasing force of spring elements 82 fastens pin in resilient member 80, to thereby removably fasten the PCB to the frame. Affixing tabs 81 are also inserted into corresponding insertion apertures 40b' in PCB 40'. When tabs 81 are thus engaged within apertures 40b, bights 81 prevent the tabs from deviating upon external impact. In order to ensure that resilient members 80 do not deviate once assembled, affixing tabs 81 may be soldered to the underside of PCB 40' to permanently attach resilient members 80 to PCB 40'.

If PCB 40' needs to be replaced due to damage to any of the surface-mounted electronic components, the PCB can be removed by pushing upward on it by inserting a tool or finger into isolation apertures 74. The PCB can be detached easily from frame 70 by disengaging pins 73 from spring elements 82. Thus, assembly and disassembly are facilitated and no separate hardware is necessary for handling this preferred embodiment. This allows the apparatus to function more consistently and enhances product reliability.

As described above, the preferred embodiments of the printed circuit board mounting apparatus in accordance with the present invention provide structural features for preventing sagging of the PCB, and present time saving assembly and disassembly steps thereby enhancing production yield.

While there have been illustrated and described what are to be considered the preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the scope thereof. Therefore, it is understood that the present invention is not limited to the particular embodiments disclosed as the best mode contemplated for carrying out the present invention, but that the present invention includes all embodiments falling within the scope of the appended claims.

I claim:

1. A printed circuit board fixing apparatus for affixing a printed circuit board onto which a variety of electronic components are mounted within a monitor case and shielding the printed circuit board from electromagnetic waves, the printed circuit board having a thin copper film surface on a first side thereof, an engaging slot and an insertion aperture adjacent the slot, said printed circuit board fixing apparatus comprising:

a frame including at least two opposing side walls, each of said side walls having a protrusion for supporting the printed circuit board with the film surface disposed upward;

a shield plate attached to the bottom of said frame and including an integral engaging pin extending upward to be received in the engaging slot of the printed circuit board; and a resilient clip including a contact device and an affixing tab receivable in the insertion aperture for securing the printed circuit board to said frame, said contact device adapted to contact said engaging pin to provide contact between said shield plate and the printed circuit board through said engaging pin.

2. The fixing apparatus of claim 1, wherein said contact device of said resilient clip comprises a pair of opposed elastic members disposed above said affixing tab, said elastic member biased toward one another and converging to contact said engaging pin therebetween.

3. The fixing apparatus of claim 2, wherein said engaging pin is a flat key member.

4. The fixing apparatus of claim 1, wherein said resilient clip is tubular above said affixing tab and said contact device comprises inwardly biased convexly concave elastic tabs which converge toward one another at a contact point to contact said engaging pin therebetween.

5. The fixing apparatus of claim 4, wherein said engaging pin is a cylindrical member.

6. The fixing apparatus of claim 1, wherein said frame further comprises a locking tab provided on each said side wall for securely locking the printed circuit board onto said frame, said locking tabs aligned with said protrusions to trap the printed circuit board therebetween.

7. The fixing apparatus of claim 1, further wherein said frame further comprises a brace extending along the bottom of said frame to reinforce said frame and further support the printed circuit board.

8. A support assembly for supporting a printed circuit board having at least two mounting apertures adjacent one another, said support assembly comprising:

a frame for supporting the printed circuit board;

a shield plate attached to said frame, said shield plate comprising an engaging pin received in one of said mounting apertures of the printed circuit board;

a securing member including an affixing tab received in the other one of said mounting apertures of the printed circuit board and a contact device for contacting said engaging pin to provide electrical conductive contact between the printed circuit board and said shield plate to thereby ground the printed circuit board.

9. The support assembly of claim 8, wherein said contact device of said securing member comprises a pair of opposed elastic members disposed above said affixing tab, said elastic members biased toward one another and converging to contact said engaging pin therebetween.

10. The support assembly of claim 9, wherein said engaging pin is a flat key member.

11. The support assembly of claim 8, wherein said contact device comprises inwardly biased strips formed on opposing walls of said securing member, said strips converging toward one another at a contact point to contact said engaging pin therebetween.

12. The support assembly of claim 11, wherein said engaging pin is a cylindrical member.

13. The support assembly of claim 8, wherein said frame further comprises opposing frame side walls and a pair of vertically aligned locking protrusions provided on each of said side walls for securely locking the printed circuit board into said frame.

14. The support assembly of claim 8, wherein said frame further comprises a ribbed member extending a length therealong to support the printed circuit board.

* * * * *